United States Patent [19]

Bottka et al.

[11] 4,316,206
[45] Feb. 16, 1982

[54] TWO COLOR NARROW BANDWIDTH DETECTOR

[75] Inventors: Nicholas Bottka; Marian E. Hills, both of Ridgecrest, Calif.

[73] Assignee: The United States of America as represented by the Secretary of the Navy, Washington, D.C.

[21] Appl. No.: 140,398

[22] Filed: Apr. 14, 1980

[51] Int. Cl.³ .............................................. H01L 27/14
[52] U.S. Cl. ........................................ 357/30; 357/15; 357/16
[58] Field of Search ............................. 357/30, 15, 16

[56] References Cited

U.S. PATENT DOCUMENTS

| | | | |
|---|---|---|---|
| 3,757,123 | 9/1973 | Archer | 250/338 |
| 3,980,915 | 9/1976 | Chapman | 250/338 |
| 4,110,778 | 8/1978 | Eden | 357/30 |
| 4,119,994 | 10/1978 | Jain | 357/16 |
| 4,213,138 | 7/1980 | Campbell | 357/30 |
| 4,218,143 | 8/1980 | Bottka | 357/30 X |

OTHER PUBLICATIONS

Bottka et al., *Appl. Phys. Lett.*, 33(8), 15 Oct. 1978, pp. 765-767.

*Primary Examiner*—Martin H. Edlow
*Attorney, Agent, or Firm*—Robert F. Beers; W. Thom Skeer; Kenneth G. Pritchard

[57] ABSTRACT

A narrow two color semiconductor detector created from the built in field between epitaxial layers due to interface traps. Opposite polarity on opposite sides of the interface result in a net photocurrent created on each side which flows in opposing directions. The substrate supporting the epitaxial layers provides a cutoff filter range for light entering through the substrate.

7 Claims, 2 Drawing Figures

TWO COLOR NARROW BANDWIDTH DETECTOR

BACKGROUND OF THE INVENTION

1. Field of the Invention

This invention pertains to semiconductor devices for measuring narrow band energy gaps. In particular it pertains to an apparatus and method which permits narrow band two color measurements of adjoining wavelength bands.

2. Description of the Prior Art

While several semiconductor detectors are in existence, none have two narrow band ranges with current inversion. Current inversion is known due to gap difference, but has only been observed as a broadband effect.

The growing use of lasers, particularly infrared lasers, has resulted in a growing demand for monitoring and control of tunable lasers. The narrower the spectral bandwidth of tunable lasers becomes, the greater the potential for communication classification.

BRIEF SUMMARY OF THE INVENTION

According to the present invention, a substrate of predetermined band gap operates as a lower level filter for incoming light. Upon passing through the substrate, light below the band gap energy level passes through a plurality of epitaxial layers with an interface trap contained in the epitaxial layers. The interface trap produces a depletion condition on each side of the interface. This depletion condition has an opposite polarity on the two sides of the interface. The net photocurrent created on one side of the interface will flow in the reverse direction of current generated on the opposite side of the interface.

The alloy composition of the epitaxial layers across the interface can control the frequency and band gap of the response on each side of the interface. The collecting efficiency can be optimized because generated carriers are in the layers rather than on the surfaces.

DESCRIPTION OF THE PREFERRED EMBODIMENT

Figure 1:
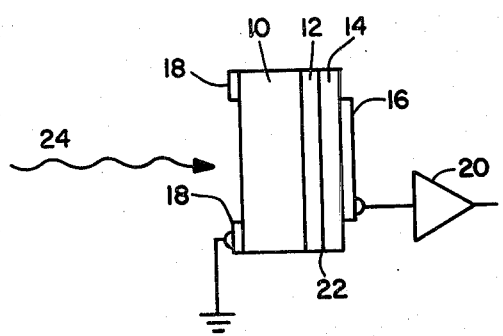
FIG. 1 is a view of the layered arrangement of the present invention.

FIG. 1 shows a substrate 10 with epitaxial layers 12 and 14 grown on it. For purposes of example, substrate 10 can be made of N+ GaAs while epitaxial layers 12 and 14 are composed of N type $GaAs_{1-x}Sb_x$ where X = the mole fraction of GaSb.

The use of $GaAs_{1-x}Sb_x$ is exemplary for building a device which is responsive in the near infrared energy region. Placed on the top surface of epitaxial layer 14 is a Schottky barrier contact 16. The Schottky contact 16 can be a platinum-gold contact. Placed on the bottom of substrate 10 are ohmic electrodes 18 which can be made of gold-germanium. An amplifier 20 is shown attached to Schottky contact 16 to amplify current response. Epitaxial layers 12 and 14 are exemplary only and present an interface 22 that exists between them. More than two epitaxial layers can be used depending on the type of frequency and bandwidth response desired. What must exist, despite the number of epitaxial layers, is a built-in field difference due to interface traps within the epitaxial layers. These traps produce a depletion condition on either side of an interface. This depletion condition produces an opposite polarity on the two sides of the interface. The net photocurrent created on one side of the interface will flow in the reverse direction of current generated on the opposite side of the interface.

The epitaxial layers have gap energies smaller than the substrate. By proper choice of the last epitaxial layer thickness, the response for the narrowest gap can be enhanced. In general, the same order of magnitude as that of the diffusion of carriers in the epitaxial layer will produce this effect. The collecting efficiency of this two color device is optimized because generated carries are created in the epitaxial layers rather than on their surfaces. This avoids surface recombination and permits carriers to see the total field on their side of the interface.

For light 24 of wavelength λ, shown entering the semiconductor device through the substrate side, light 24 will be filtered by substrate 10 of λ is shorter than the wavelength cutoff of substrate 10. Light 24 has a threshold wavelength $\lambda_{BG}$, to pass through substrate 10. If light 24 has a wavelength longer than $\lambda_{BG}$, light 24 passes through substrate 10 and encounters the first epitaxial layer 12. For a narrow range of wavelengths, light 24 can be absorbed in epitaxial layer 12 and create a photocurrent in a particular direction. If light 24 has a wavelength outside that narrow band gap, it will pass through epitaxial layer 12, across interface 22, and into epitaxial layer 14. In epitaxial layer 14, light 24 is once again passing through a narrow band gap region which will undergo absorption of light 24, if light 24 has a wavelength within that region. However, absorption of light 24 in epitaxial layer 14 gives rise to a photocurrent in the opposite direction from that of absorption in epitaxial layer 12.

Figure 2:
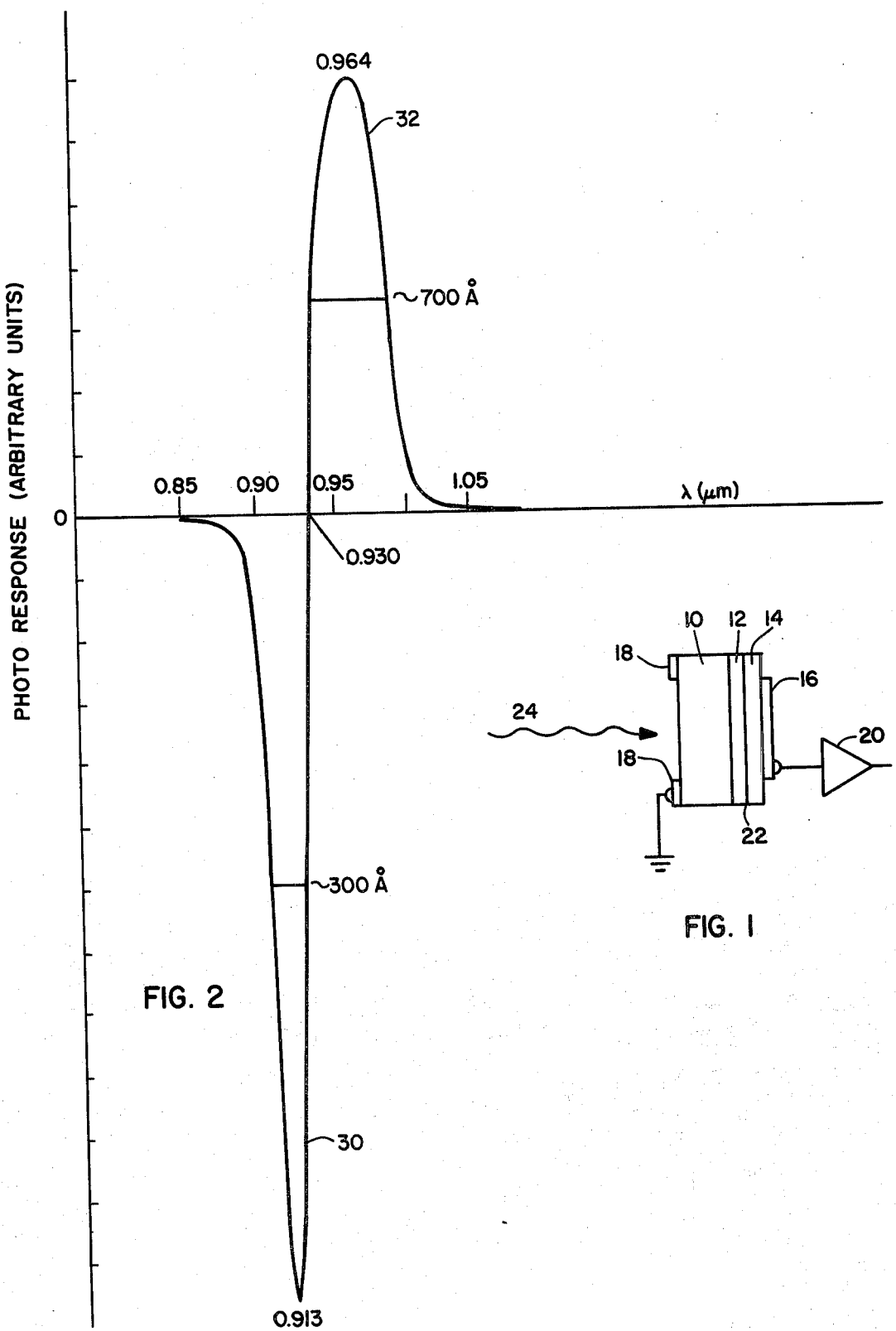
FIG. 2 is a photoresponce curve of current versus wavelength that is possible with the present invention.

A response curve for this phenomenon is shown in FIG. 2. Lower spike 30 and upper spike 32 represent the response possible in a single device as the wavelength changes across the region shown. Peak-to-peak separation shown in FIG. 2 is 510 Å. FIG. 2 shows that the intensity of the photocurrent response and the half width of the band gaps can vary significantly within the same device. For the response curve shown in FIG. 2, the band gap wavelength of substrate 10 is 0.9 μm and the composition of epitaxial layer 12 is $GaAs_{1-x}Sb_x$ where X = 0.04 and the composition of epitaxial layer 14 is $GaAs_{1-x}Sb_x$ where X = 0.08. Peak 30 corresponds to epitaxial layer 12 and peak 32 corresponds to the response for epitaxial layer 14.

The specific example shown is merely exemplary and is not a limitation of the type of response and spectral ranges possible with the present invention.

It is obvious to those skilled in the art that numerous variations to this device can be made.

What is claimed is:

1. A narrow band two color detector with current inversion comprising:
   a substrate having a band gap which filters wavelengths of light shorter than $\lambda_{BG}$, which is the wavelength of light with energy equal to the band gap of said substrate;
   a plurality of epitaxial layers placed on the filtered side of said substrate which have gap energies smaller than said substrate, said epitaxial layers having a built in field between two of said plurality of layers due to interface traps; and electrical contacts placed on the unfiltered side of said substrate and on the outermost layer of said plurality of epitaxial layers for creating a predetermined voltage across said detector, such that light absorbed on one side of said interface traps produces an inverted photoelectric current from light absorbed on the opposite side of said interface traps.

2. A narrow band two color detector as described in claim 1 wherein the plurality of epitaxial layers is two.

3. A narrow band two color detector as described in either claim 1 or claim 2 wherein said substrate comprises N+ type GaAs.

4. A narrow band two color detector as described in either of claims 1 or 2 wherein said plurality of epitaxial layers are comprised of N-type $GaAs_{1-x}Sb_x$, where X equals the mole fraction of GaSb.

5. A narrow band two color detector as described in claim 3 wherein said plurality of epitaxial layers are comprised of N-type $GaAs_{1-x}Sb_x$, where X equals the mole fraction of GaSb.

6. A narrow band two color detector as described in either of claims 1 or 2 wherein said electrical contacts comprise a platinum-gold Schottky contact on the epitaxial side and gold-germanium ohmic contacts on the substrate side.

7. A narrow band two color detector as described in claim 5 wherein said electrical contacts comprise a platinum-gold Schottky contact on the epitaxial side and gold-germanium ohmic contacts on the substrate side.

* * * * *